US010148021B2

(12) United States Patent
Knieriem et al.

(10) Patent No.: US 10,148,021 B2
(45) Date of Patent: Dec. 4, 2018

(54) BACKSHELL INSTALLATION GUIDE

(71) Applicant: Gulfstream Aerospace Corporation, Savannah, GA (US)

(72) Inventors: Christopher Knieriem, Savannah, GA (US); Jonathan Edwards, Savannah, GA (US)

(73) Assignee: Gulfstream Aerospace Corporation, Savannah, GA (US)

( * ) Notice: Subject to any disclaimer, the term of this patent is extended or adjusted under 35 U.S.C. 154(b) by 191 days.

(21) Appl. No.: 15/169,973

(22) Filed: Jun. 1, 2016

(65) Prior Publication Data

US 2017/0352977 A1    Dec. 7, 2017

(51) Int. Cl.
*H01R 9/24* (2006.01)
*H04Q 1/00* (2006.01)
*H05K 7/14* (2006.01)

(52) U.S. Cl.
CPC ............ *H01R 9/2416* (2013.01); *H04Q 1/00* (2013.01); *H05K 7/1412* (2013.01)

(58) Field of Classification Search
CPC .... B65B 1/04; B65B 3/04; B65B 7/02; B65D 65/46; C11D 17/043; C11D 17/044
See application file for complete search history.

(56) References Cited

U.S. PATENT DOCUMENTS

| | | | | |
|---|---|---|---|---|
| 4,615,577 A * | 10/1986 | Anderson | ............ | H01R 13/516 439/468 |
| 4,715,827 A * | 12/1987 | Furman | ................ | H01R 13/514 439/275 |
| 5,791,042 A * | 8/1998 | Baum | .................. | H05K 7/1425 29/760 |
| 8,054,619 B1 * | 11/2011 | Antosh | ................ | H05K 7/1418 361/679.31 |
| 8,062,054 B2 * | 11/2011 | Su | ......................... | H01R 13/502 439/362 |
| 2012/0264333 A1 * | 10/2012 | Xiao | .................... | H01R 12/724 439/607.55 |
| 2017/0352977 A1 * | 12/2017 | Knieriem | ............. | H01R 13/516 |

* cited by examiner

*Primary Examiner* — Minh Trinh
(74) *Attorney, Agent, or Firm* — LKGlobal | Lorenz & Kopf, LLP (57) ABSTRACT

An installation guide for a backshell installation guide is disclosed herein. The installation guide includes a first feature formed therein to receive at least a portion of the backshell to retain the backshell in the installation guide. The backshell guide also includes a second feature formed therein to align the installation guide with a portion of an equipment rack containing a circuit card to which the backshell is to be connected. The alignment feature positions mating connectors of the backshell in alignment with connectors of the circuit card facilitating interconnection of the mating connectors and the connectors by moving the installation guide toward the circuit card with the alignment feature engaged with the portion of the equipment rack.

9 Claims, 7 Drawing Sheets

BACKSHELL INSTALLATION GUIDE

TECHNICAL FIELD

The present invention generally relates to backshell connector units that interconnect with circuit cards, and more particularly relates to an installation guide for backshell connectors that facilitate backshell installation.

BACKGROUND

Contemporary business aircraft require sophisticated navigation, flight control and flight support units to provide safe air transportation. Generally, an aircraft electronics unit includes several circuit cards mounted into a chassis or equipment rack. Each of the circuit cards are coupled to various systems or subsystems of an aircraft by a backshell connector and cabling. A non-limiting example of such an electronic unit is a Network Integration Module (NIM) consisting of at least one circuit card (which may have one or more redundant backup circuit cards) that promotes communication between various systems onboard the aircraft.

Due to physical space, wiring harness configurations and other constraints, some backshells require a technician to perform a "blind install" of the backshell to the circuit card. The installation procedure is referred to as "blind" when the technician must attempt to align the mating connector(s) of the backshell with the connector(s) of the circuit card without being able to see the connector(s) or mating connector(s). As will be appreciated, this can be a precarious procedure resulting in bent circuit card pins, damaged connector shrouds or other physical damage that must be repaired or reworked before the technician can again attempt the blind install. Thus, a blind install process can be time-consuming and expensive if multiple installation attempts must be made. Moreover, during the blind installation process, the technician must be grounded (via a ground strap) to protect the backshell and circuit card from electrostatic discharge (ESD) damage. As will be appreciated, the more protracted the handling of the backshell during the installation process, the more likely it is that the backshell or circuit card will suffer physical or ESD damage.

Accordingly, it is desirable to provide an installation guide for a backshell of an aircraft electronics unit. It is further desirable that the installation guide both protect the backshell and facilitate its interconnection to the circuit card in a way so as not to damage the mating connector(s) of the backshell or the connector(s) of the circuit card. Furthermore, other desirable features and characteristics will become apparent from the subsequent detailed description and the appended claims, taken in conjunction with the accompanying drawings and the foregoing technical field and background.

BRIEF SUMMARY

Exemplary embodiments of a backshell installation guide are disclosed herein.

In a first non-limiting embodiment, an installation guide for a backshell includes a first feature formed in the installation guide to receive at least a portion of the backshell to retain the backshell in the installation guide. The backshell installation guide also includes a second feature formed therein to align the installation guide with a portion of an equipment rack containing a circuit card to which the backshell is to be connected. The alignment feature positions mating connectors of the backshell in alignment with connectors of the circuit card facilitating interconnection of the mating connectors and the connectors by moving the installation guide toward the circuit card with the alignment feature engaged with the portion of the equipment rack.

In a second non-limiting embodiment, a method is provided for installing a backshell to a circuit card installed in an equipment rack. The method includes the backshell being slid into a backshell receiving feature formed in an installation guide to retain the backshell in the installation guide. Then, an alignment feature formed in the installation guide is aligned with a portion of the equipment rack causing the mating connectors of the backshell to be aligned with connectors of the circuit card. Next, the installation guide is moved toward the circuit card by sliding the alignment feature of the installation guide along the portion of the equipment rack so that the mating connectors of the backshell remain in alignment with the connectors of the circuit card until interconnection of the mating connectors with the connectors is achieved.

In a third non-limiting embodiment, a non-transitory computer-readable medium for producing an installation guide comprises instructions that when executed by a processor cause a three-dimensional printer to successively deposit an electrostatic discharge resistant material to produce an installation guide having a first feature formed therein to slidably receive a backshell, a second feature formed therein to align with a portion of an equipment rack containing a circuit card to which the backshell is to be connected and a third feature formed therein to remove the installation guide after interconnection of the mating connectors on the backshell to the connectors on the circuit card.

BRIEF DESCRIPTION OF THE DRAWINGS

The present invention will hereinafter be described in conjunction with the following drawing figures, wherein like numerals denote like elements.

DETAILED DESCRIPTION

As used herein, the word "exemplary" means "serving as an example, instance, or illustration." The following detailed description is merely exemplary in nature and is not intended to limit application and uses. Any embodiment described herein as "exemplary" is not necessarily to be construed as preferred or advantageous over other embodiments. All of the embodiments described in this Detailed Description are exemplary embodiments provided to enable persons skilled in the art to make or use the embodiment and not to limit the scope that is defined by the claims. Furthermore, there is no intention to be bound by any expressed or implied theory presented in the preceding Technical Field, Background, Drawings Summary or the following Detailed Description.

An installation guide for a backshell of an aircraft electronics unit is disclosed herein. Without the inventive installation guide of the present disclosure, a backshell must be manually held or positioned by technician during a "blind install" procedure to interconnect mating connectors on the backshell with connectors on the circuit card. In contrast, the backshell installation guide of the present disclosure affords a technician a simple and effective installation procedure that greatly reduces or eliminates the potential of physical or electrostatic discharge damage of the backshell and/or circuit card. While the backshell installation guide of the present disclosure is described as affording an advantage in an aircraft application, it will be appreciated that the present disclosure may be advantageously employed in other applications, including but not limited to, interconnecting connector assemblies with circuit cards in ground based vehicles, watercraft and spacecraft without departing from the teachings of the present disclosure.

A greater understanding of the installation guide described above may be obtained through a review of the illustrations accompanying this application together with a review of the Detailed Description that follows.

Figure 1:
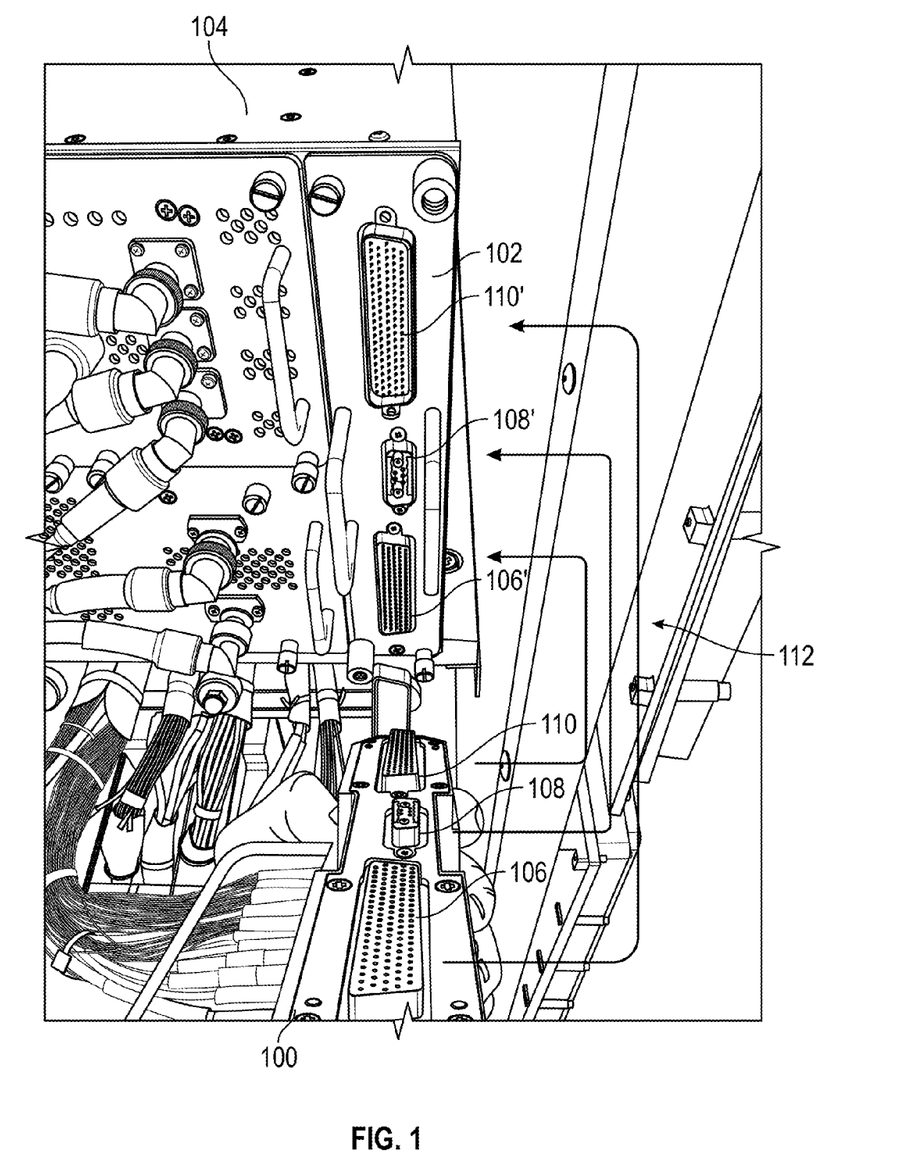
FIG. 1 is a perspective view illustrating a non-limiting embodiment of the aircraft electronics unit including a circuit card and backshell suitable for use in accordance with the teachings of the present disclosure.

FIG. 1 is a perspective view illustrating a non-limiting embodiment of an aircraft electronics unit that includes a backshell 100 and a circuit card 102 installed in an equipment rack 104 that can benefit from the teachings of the present disclosure. As illustrated in the exemplary embodiment of FIG. 1, the backshell 100 includes three mating connectors 106, 108 and 110. Each of these mating connectors must be aligned to interconnect with connectors 106', 108' and 110' of the circuit card 102 as indicated by the arrows 112. As will be appreciated, more or fewer mating connectors and circuit card connectors may be used in any particular implementation. Those skilled in the art will appreciate that as a technician attempts to align the mating connectors 106, 108 and 110 with the circuit card 102 connectors 106', 108' and 110' the backshell 100 obscures a technician's line-of-sight of the mating connectors and circuit card connectors resulting in a "blind install" installation procedure. As discussed above, blind install procedures are fraught with risks of damage to the mating connectors and/or circuit card connectors resulting in lost time and expense for rework or repair.

Figure 2:
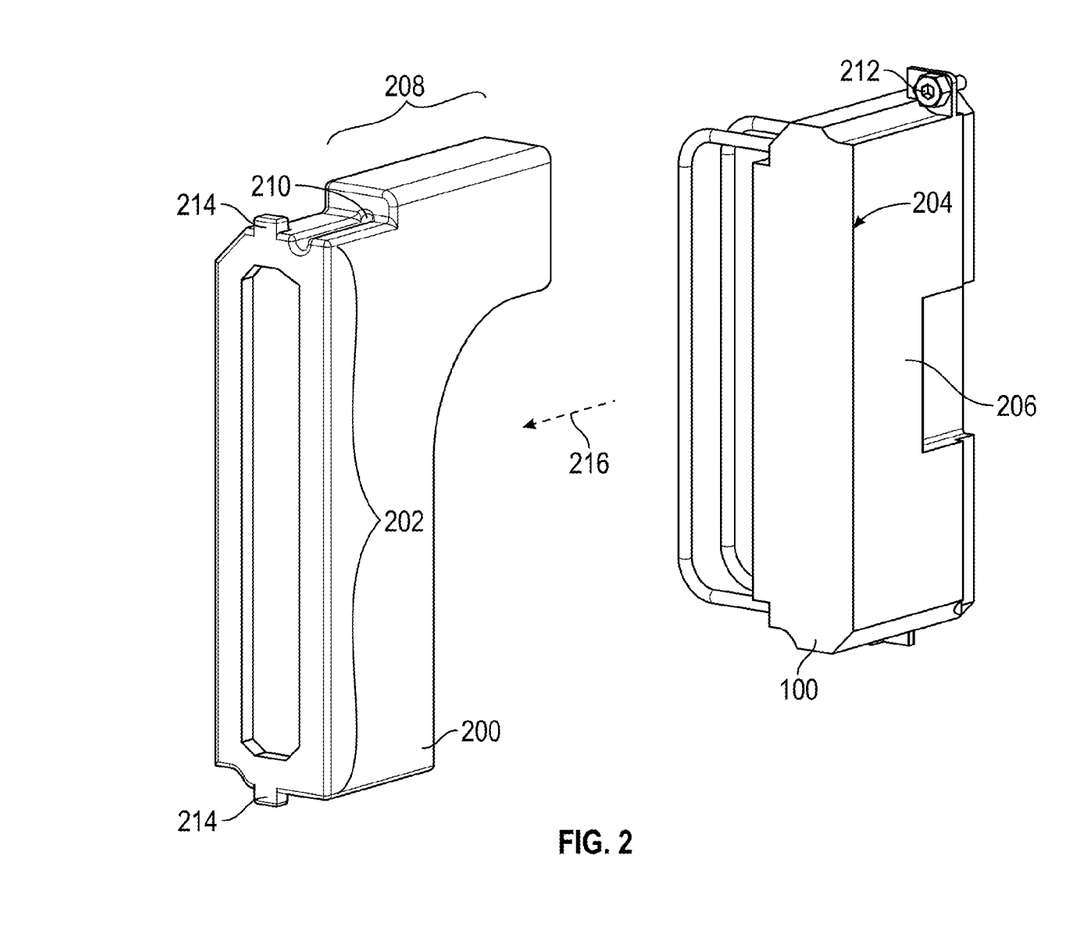
FIG. 2 is a perspective view illustrating a non-limiting embodiment of a backshell installation guide and backshell in accordance with the teachings of the present disclosure.

Referring now to FIG. 2, a perspective view illustrating a non-limiting embodiment of a backshell installation guide 200 and backshell 100 in accordance with the teachings of the present disclosure is shown. According to exemplary embodiments, the installation guide 200 receives and retains the backshell 100 within a backshell receiving feature 202 during the installation process. While still a "blind install" process, the installation guide 100 includes in alignment feature 208 that guides the backshell 100 (and thus the mating connectors) with the connectors of the circuit card for interconnection without risk of damage to either the mating connectors or the circuit card connectors as will be discussed below. As used herein, a "feature" means a shape, facet, attribute or characteristic formed in the installation guide 200. In some embodiments, the features are formed by a three-dimensional printer by depositing successive layers of material as is known in the art. In other embodiments, the features can be formed in the installation guide 200 by milling away material. Still other embodiments may form various features in the installation guide 200 using a conventional injection molding process. As will be appreciated, any combination of the foregoing techniques, or other techniques, may be used to form the features in the installation guide 200.

However the features are formed in the installation guide 200, the backshell receiving feature 202 slidably receives and securely holds the backshell 100 as indicated by the arrow 216. In the exemplary embodiment illustrated in FIG. 2, the backshell receiving feature 202 receives an edge periphery 204 of the backshell 100. Additionally, a side 206 of the backshell is supported by the backshell receiving feature 202 as can best be seen in FIG. 6. In other embodiments, other portions of the backshell 100 may be used to receive and retain the backshell 100 within the installation guide 200 via the backshell receiving feature 202 as will be appreciated by those skilled in the art. In the exemplary embodiment of FIG. 2, the installation guide 200 also includes an aperture 210 through which a tool may pass to engage and secure a threaded fastener 212 on the backshell 100 after the mating connectors have been interconnected with the connectors of the circuit card. The threaded fastener 212 prevents the backshell 100 from becoming dislodged from the circuit card (102 of FIG. 1) after the installation process is complete. To remove the installation guide 200 after the installation is complete, the installation guide 200 includes a removal feature 214 that allows the technician to grasp and release the backshell 100 from the backshell receiving feature 202 and thus the installation guide 200.

Figure 3:
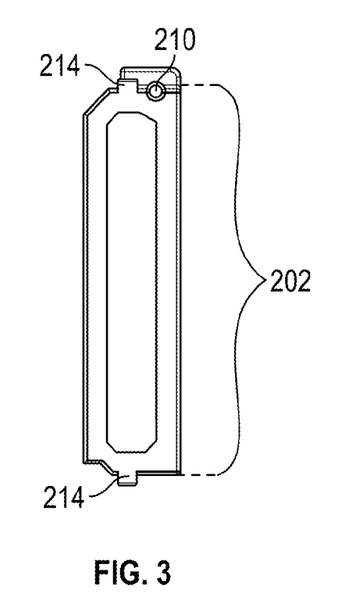
FIG. 3 is a front plan view of the backshell installation guide of FIG. 2 in accordance with the teachings of the present disclosure.
Figure 4:
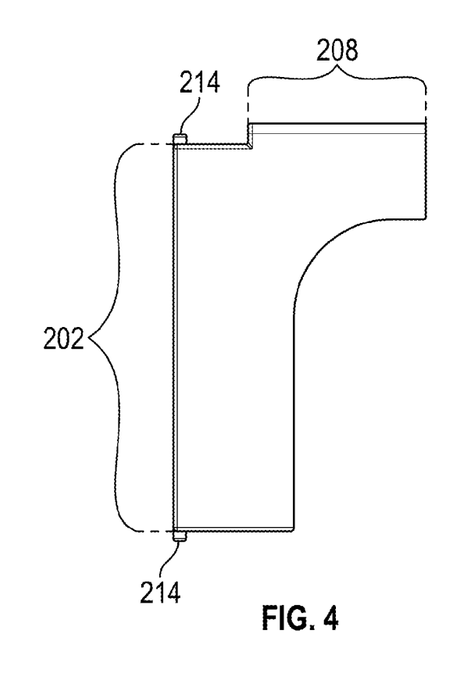
FIG. 4 is a side plan view of the backshell installation guide of FIG. 2 in accordance with the teachings of the present disclosure.
Figure 5:
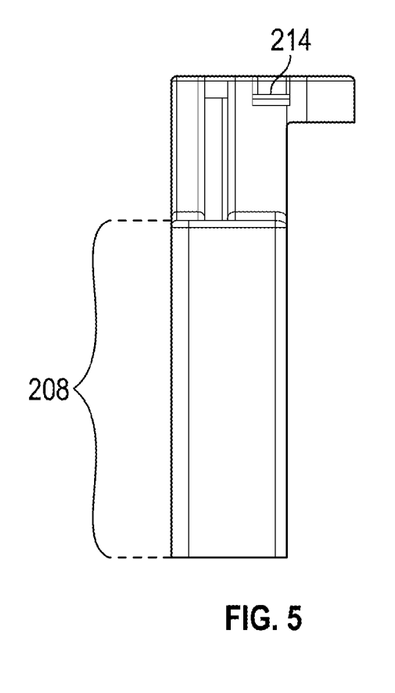
FIG. 5 is a top plan view of the backshell installation guide of FIG. 2 in accordance with the teachings of the present disclosure.

With continued reference to FIG. 2, FIGS. 3-5, provide other views illustrating a non-limiting embodiment of the installation guide 200 of the present disclosure. As will be appreciated, FIG. 3 is a front plan view, FIG. 4 is a side plan view and FIG. 5 is a top plan view of an exemplary embodiment of the installation guide 200. These various views provide further illustration of the backshell receiving (first) feature 202, the alignment (second) feature 208 and the removal (third) feature 214. As will be appreciated by those skilled in the art, more or fewer features may be included in any particular implementation depending upon the configuration of the backshell to be retained and guided into interconnection with any particular circuit card. In addition to physical security, the present disclosure contemplates that the installation guide 200 will protect the backshell 100 from electrostatic discharge (ESD) damage during the installation process. Accordingly, in some embodiments, the installation guide 200 comprises an electrostatic discharge resistant material. As used herein, "electrostatic discharge" means a sudden flow of electricity between two electrically charged objects caused by contact, an electrical short or dielectric breakdown. As will be appreciated, various materials are known to resist electrostatic discharge. As a non-limiting example, the present disclosure contemplates that an antistatic plastic may be used to form the installation guide 200. As used herein, "antistatic" is intended to refer generally to any material which inhibits triboelectric charging.

With continued reference to FIGS. 2-5, FIG. 6 is a perspective view illustrating a non-limiting embodiment of the installation guide 200 (with retained backshell 100) prior to alignment with an equipment rack 104 (see FIG. 1) in accordance with the teachings of the present disclosure. As noted above, the installation guide 200 includes an alignment feature 208 that is configured to align with a portion 600 of the equipment rack 104 as indicated by arrow 602 in a manner that will align the mating connectors of the backshell 100 with the connectors of the circuit card 102 (See FIG. 1). In the embodiment illustrated in FIG. 6, an outside corner 600 of the equipment rack 104 has been selected as the portion of the equipment rack that the installation guide 200 will be aligned. As will be appreciated by those skilled in the art, using the outside corner 600 as a reference, the installation guide 200 may be dimensioned such that the mating connectors of the backshell 100 are aligned with the connectors of the circuit card 102 when the alignment feature 208 is engaged with the outside corner 600 of the equipment rack 104. The mating connectors of the backshell 100 with remain in interconnection alignment with the connectors of the circuit card 102 as the installation guide 200 (and thus the backshell 100) is moved (slid) towards the circuit card with the alignment feature 208 engaged with the outside corner 600 of the equipment rack. To prevent damage of the mating connectors or circuit card connectors, the alignment feature 208 of the installation guide 200 has a portion 604 that extends a distance sufficient to allow engagement of the alignment feature 208 with the outside corner 600 of the equipment rack 104 prior to the mating connector's coming into contact with the connectors of the circuit card.

Figure 6:
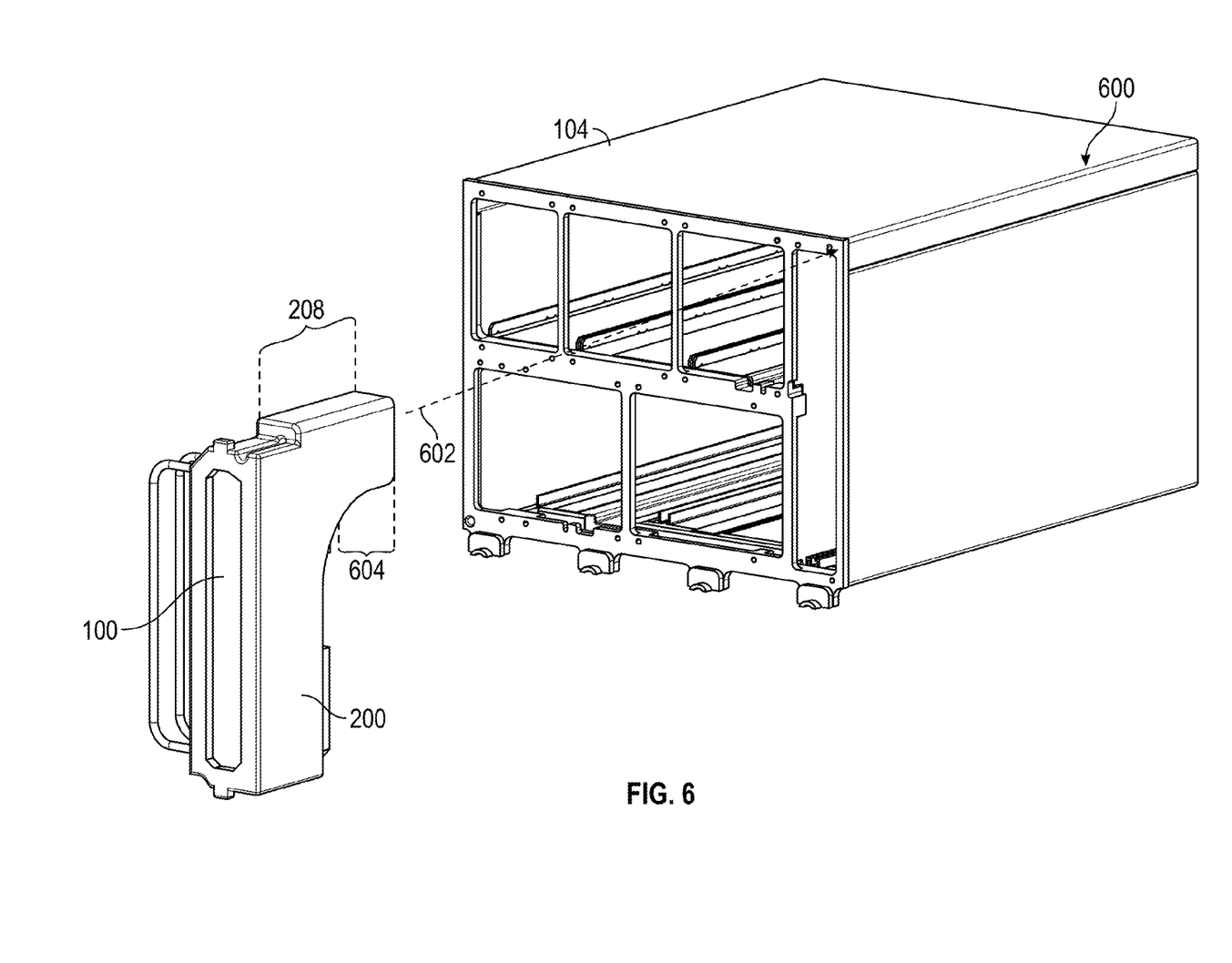
FIG. 6 is a perspective view illustrating a non-limiting embodiment of the backshell installation guide and backshell prior to alignment with an equipment rack in accordance with the teachings of the present disclosure.
Figure 7:
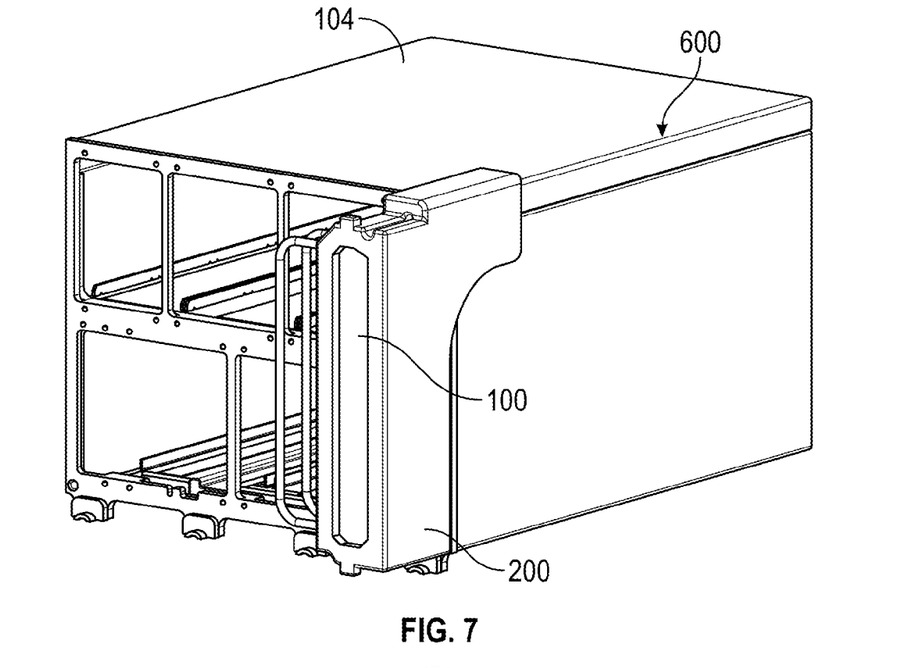
FIG. 7 is a perspective view illustrating a non-limiting embodiment of the backshell installation guide and backshell after alignment with an equipment rack in accordance with the teachings of the present disclosure.
Figure 8:
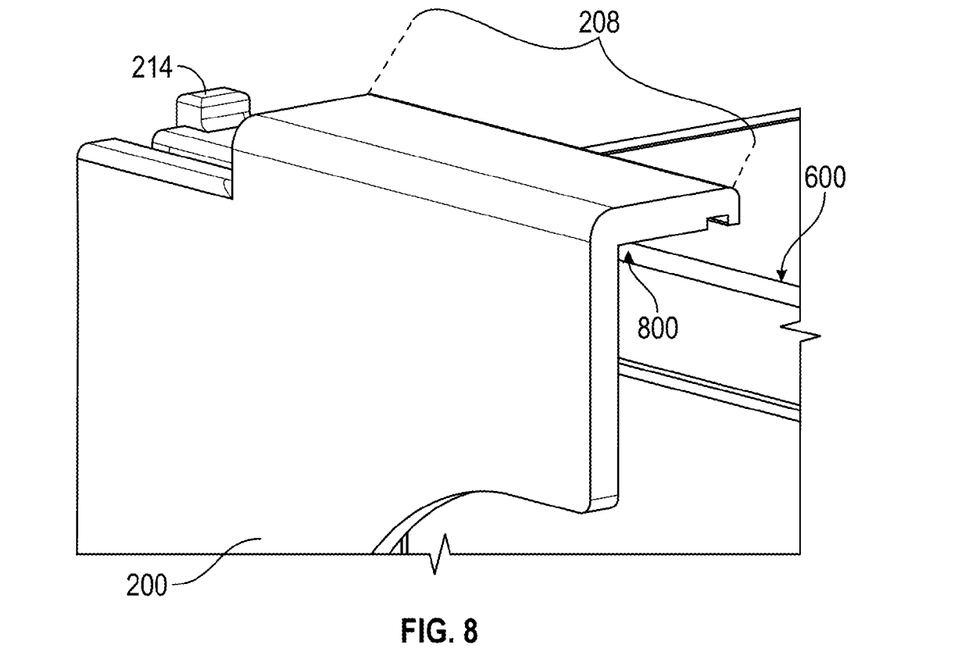
FIG. 8 is a perspective view illustrating a non-limiting embodiment of the backshell installation guide and backshell after alignment with an equipment rack in accordance with the teachings of the present disclosure.

With continued reference to FIG. 6, FIGS. 7-8 present perspective views illustrating a non-limiting embodiment of the installation guide 200 and backshell 100 after alignment with an equipment rack 104 according to the teachings of the present disclosure. As best seen in FIG. 8, an inside corner 800 of the alignment feature 208 is aligned with and maintained in contact with the outside corner 600 of the equipment rack 104 during the installation procedure. As discussed above, those skilled in the art will appreciate that by proper dimensioning of the installation guide 200 using the outside corner reference 600 of the equipment rack 104, the mating connectors of the backshell 100 can be brought into alignment with the connectors of the circuit card for proper interconnection during the installation process without risk of damage to the mating connectors or the circuit card connectors as long as the alignment feature 208 is maintained in contact with the reference portion (600) of the equipment rack 104.

Figure 9:
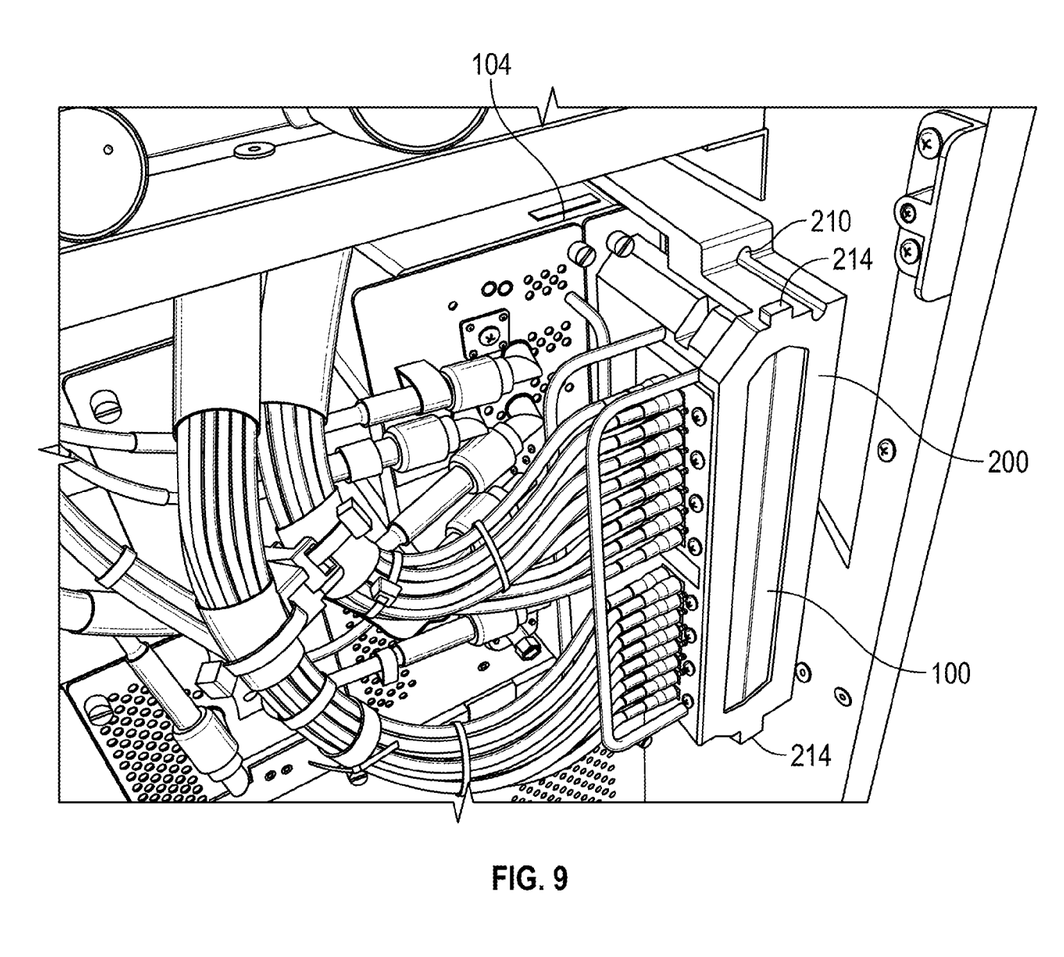
FIG. 9 is a perspective view illustrating a non-limiting embodiment of the backshell after interconnection with the circuit card installed in the equipment rack prior to removal of the installation guide in accordance with the teachings of the present disclosure.

With continued reference to FIGS. 7-8, FIG. 9 is a perspective view illustrating a non-limiting embodiment of the backshell 100 after interconnection with the circuit card 102 installed in the equipment rack 104 and prior to the removal of the installation guide 200 in accordance with the teachings of the present disclosure. After successfully interconnecting the mating connectors of the backshell 100 with the connectors of the circuit card 102, the technician can insert a tool via the aperture 210 to engage a mechanical fastener (212 of FIG. 2) to secure the backshell 100 to the circuit card 102. Thereafter, the technician need only to remove the installation guide 200 via the removal feature 214.

Figure 10:
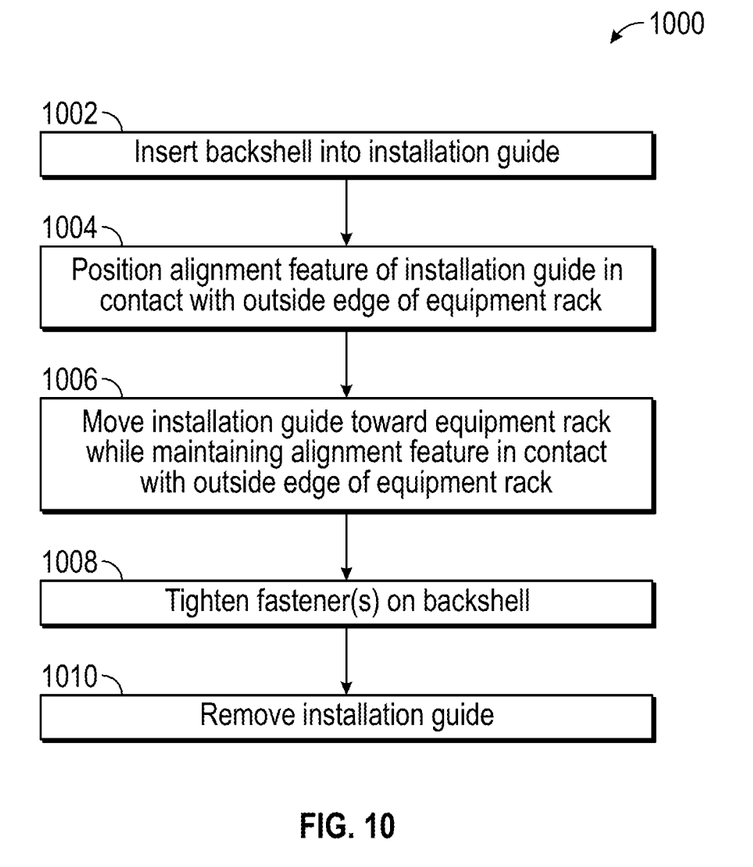
FIG. 10 is a flow diagram illustrating a non-limiting method in accordance with the teachings of the present disclosure.

FIG. 10 is a flow diagram illustrating a non-limiting method 1000 in accordance with the teachings of the present disclosure. The method 1000 begins in block 1002 with the backshell 100 being slidably inserted into the backshell receiving feature 202 of the installation guide 200 (see FIG. 2). In block 1004, the alignment feature 208 of the installation guide 200 is brought into contact with a portion (outside edge 600; see FIG. 6) of the equipment rack 104. The installation process continues in block 1006, with the technician moving (sliding) the installation guide 200 (and thus the backshell 100) towards the equipment rack 104, while maintaining the alignment feature 202 in slidable engagement with the outside edge 600 of the equipment rack 104 until the mating connectors of the backshell 100 interconnect with the connectors of the circuit card 102 (See FIGS. 7-9). Next, in block 1008, the technician tightens a fastener (212 in FIG. 2) on the backshell by inserting a tool through an aperture 210 in the installation guide (any additional fasteners may be fastened at this step or after removal of the installation guide). Finally, in block 1010, the technician removes the installation guide 200 via the removal feature 214.

As mentioned above, the present disclosure contemplates that the installation guide 200 may be formed by three-dimensional printing. Accordingly, the present disclosure contemplates a non-transitory computer-readable medium that would contain instructions that when executed by a processor would cause a three-dimensional printer to successively deposit material in a way to form any number of features in the installation guide 200 as required to receive any particular design of backshell 100. As a non-limiting example, in the embodiments illustrated in the present disclosure, the non-transitory computer-readable medium would contain instructions that when executed by a processor cause the three-dimensional printer to successively deposit an electrostatic discharge resistant material to produce a backshell installation guide having the backshell receiving (first) feature 208 to receive a portion (204 in FIG. 6) of the backshell 100, the alignment (second) feature 308 to engage with a portion (600 in FIG. 6) of the equipment rack 104 and a removal (third) feature 214 to facilitate removing the installation guide 200 after the installation process is complete.

It will be appreciated that skilled artisans may implement the described functionality of an installation guide in varying ways for each particular application, but such implementation decisions should not be interpreted as causing a departure from the scope as set forth in the claims.

In this document, relational terms such as first and second, and the like may be used solely to distinguish one entity or action from another entity or action without necessarily requiring or implying any actual such relationship or order between such entities or actions. Numerical ordinals such as first, second, third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as connect or coupled to that are used in describing a relationship between different elements does not imply that a direct physical connection must be made between these elements. For example, two elements may be connected to each other physically, electronically, logically, or in any other manner, through one or more additional elements.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the disclosure as set forth in the appended claims.

What is claimed is:

1. An installation guide for a backshell, the backshell having a mating connector to a connector on a circuit card installed in an equipment rack, the installation guide comprising:
    an installation guide body having:
        a first feature formed therein to receive at least a portion of the backshell to retain the backshell in the installation guide; and
        a second feature formed therein to align the installation guide with a portion of the equipment rack prior to the mating connector of the backshell contacting the connector of the circuit card;
    wherein, the installation guide having the backshell retained within the first feature is configured to position the mating connector of the backshell in alignment with the connector of the circuit card facilitating interconnection of the mating connector with the connector as the installation guide is moved toward the circuit card with the second feature aligned with the portion of the equipment rack.

2. The installation guide of claim 1, further comprising a third feature formed on the installation guide body to facilitate removal of the installation guide after interconnection of the mating connector to the connector on the circuit card.

3. The installation guide of claim 1, further comprising an aperture formed in the installation guide body to access a fastener on the backshell.

4. The installation guide of claim 1, wherein the first feature is formed to slidably receive the at least a portion of the backshell.

5. The installation guide of claim 1, wherein the second feature is formed with an inside corner to align with the portion of the equipment rack.

6. The installation guide of claim 5, wherein the inside corner of the second feature is configured align with an outside corner portion of the equipment rack.

7. The installation guide of claim 6, wherein the inside corner of the second feature remains in slidable engagement with the outside corner of the equipment rack as the installation guide is moved toward the equipment rack thereby maintaining the mating connector in alignment with the connector of the circuit card to facilitate interconnection thereof.

8. The installation guide of claim 1, wherein the installation guide body is formed of an electrostatic discharge resistant material.

9. The installation guide of claim 8, wherein the electrostatic discharge resistant material comprises an antistatic material.

* * * * *